United States Patent [19]

Olsson

[11] Patent Number: 5,002,494

[45] Date of Patent: Mar. 26, 1991

[54] PRINTED CIRCUIT BOARD EDGE CONNECTOR

[75] Inventor: Billy E. Olsson, New Cumberland, Pa.

[73] Assignee: AMP Incorporated, Harrisburg, Pa.

[21] Appl. No.: 349,741

[22] Filed: May 9, 1989

[51] Int. Cl.[5] .................................... H05K 1/00

[52] U.S. Cl. .................................... 439/77; 439/493; 439/632

[58] Field of Search .................................... 439/326–328, 439/67, 77, 492, 493, 496, 629, 630, 631, 632

[56] References Cited

U.S. PATENT DOCUMENTS

| | | | |
|---|---|---|---|
| 3,614,707 | 10/1971 | Kaufmann | 439/67 |
| 4,169,641 | 10/1979 | Olsson . | |
| 4,172,626 | 10/1979 | Olsson . | |
| 4,181,386 | 1/1980 | Olsson . | |
| 4,227,767 | 10/1980 | Mouissie | 439/493 |
| 4,252,389 | 2/1981 | Olsson . | |
| 4,252,392 | 2/1981 | Whiteman, Jr. . | |
| 4,379,608 | 4/1983 | Olsson et al. . | |
| 4,575,172 | 3/1986 | Walse et al. . | |
| 4,577,922 | 3/1986 | Stipanuk et al. . | |
| 4,587,596 | 5/1986 | Bunnell | 439/67 |
| 4,717,345 | 1/1988 | Gordon et al. | 439/67 |
| 4,718,859 | 1/1988 | Gardner | 439/493 |
| 4,737,120 | 4/1988 | Grabbe et al. . | |
| 4,824,391 | 4/1989 | Ii | 439/77 |

*Primary Examiner*—David Pirlot
*Attorney, Agent, or Firm*—Bruce J. Wolstoncroft

[57] ABSTRACT

An electrical connector (2) for electrically connecting a printed circuit board (6) to a cable (8) has terminals (4) which are provided therein. The cable (8) is maintained in the connector (2) in a recess provided between a housing ( 10) and a shroud (12) of the connector (2). An end of the cable extends into a board receiving channel, the end of the cable having exposed conductors provided thereon. An edge of the printed circuit board (6) is inserted into a board receiving channel of the connector (2) under reduced insertion force conditions. The connector is then rotated relative to the board, causing the terminals to resiliently engage the board. The resilient engagement causes the circuit board (6) to be placed in electrical connection with the cable (8). The board is maintained in position relative to the connector by locking projections (32), thereby insuring that a positive, reliable electrical connection will be effected.

20 Claims, 7 Drawing Sheets

PRINTED CIRCUIT BOARD EDGE CONNECTOR

FIELD OF THE INVENTION

The invention is directed to an electrical connector which is positioned on the edge of a printed circuit board. More particularly, the connector cooperates with a flat flexible cable or the like to place the cable in electrical engagement with pads provided on the printed circuit board.

BACKGROUND OF THE INVENTION

The most common way to connect a flat flexible cable (FFC) to circuit pads on a printed circuit board is via connectors soldered to the board. These connectors are usually mounted on the circuit board at a distance away from the edges of the board, such that the contact legs of the connectors can extend through openings provided in the board, thereby allowing wave soldering to occur. It is not unusual to have ten to twelve connectors soldered to various locations on the board.

In order to reduce the size of the printed circuit board, there is now a trend to remove these connectors from the top and bottom surfaces of the circuit board, and at the same time eliminate the soldering operations associated with them. Such a solution requires that the circuit paths be extended so that the circuit pads which are be electrically connected to the connector are position proximate the edges of the circuit board. Utilizing the edge of the board for the interconnection allows the electrical connector to be electrically connected to the circuit board without the need for solder. The use of the edge of the board also allows the top and bottom surfaces to accommodate other valuable pieces of circuitry.

A significant problem with edge connectors which are utilized to terminate high density FFC relates to the fact that it is extremely difficult to terminate the FFC without damaging the individual conductors of the cable. Various attempts have been made to pierce through the very fragile conductors and stake or fold the piercing legs subsequent to penetration. Understandably such terminations are very unreliable.

Another consideration with edge connectors is the lateral position of the connectors must be accurately controlled in order for the contacts of the connector to make proper electrical contact with the circuit pads of the printed circuit board. Attempts to position the connector by milling slots about the board edges have proven to be expensive and impractical.

An associated problem with edge connectors relates to the problem of locking the connectors to the board. It has proven difficult to lock the connector to the board in such a manner as to insure that an electrical connection will be provided over time.

SUMMARY OF THE INVENTION

The invention is directed to an electrical connector which allows flexible cables to be terminated to conductive areas provided on the edges of printed circuit board. The cables are terminated to the circuit board without the need of special tooling, thereby allowing the connector to be utilized in field applications. The electrical connector is moved into engagement with the circuit board so that the insertion force required is reduced. This allows the connectors to be easily installed. Once the circuit boards are inserted into the connectors, the connectors are moved between a first position and a second position.

The electrical connector has a board receiving area which is dimensioned to receive the circuit board therein. A cable receiving means is provided proximate the board receiving area, the cable receiving means cooperates with the cable to retain the cable in position with respect to the electrical connector.

Support means are positioned proximate the board receiving area, the support means are provided to cooperate with the circuit board and a respective end of the cable, to insure that the circuit board and the cable will be retained in position relative to the electrical connector. Resilient means cooperate with the circuit board when the connector is moved from the first position to the second position. The resilient means applying a force to the circuit board, thereby maintaining the circuit board in cooperation with the support means and insuring that a positive electrical connection is effected between the circuit board and the cable.

The support means have first support means and second support means. The first support means are adjacent to the board receiving area, and are provided to cooperate with the circuit board and the end of the cable. The first support means are configured to allow the circuit board to be pivoted thereabout from the first position to an intermediate position, thereby placing the circuit board and the cable in electrical engagement. The second support means cooperate with the circuit board when the circuit board is moved from the intermediate position to the second position, to maintain the circuit board in the second position.

Alignment means can also be provided to insure that the housing means of the electrical connector are properly positioned on the circuit board. The alignment means is a template in which the housing means are positioned. The template provides the alignment required to insure that the circuit board will be provided in electrical engagement with the cables.

DETAILED DESCRIPTION OF THE INVENTION

Figure 2:
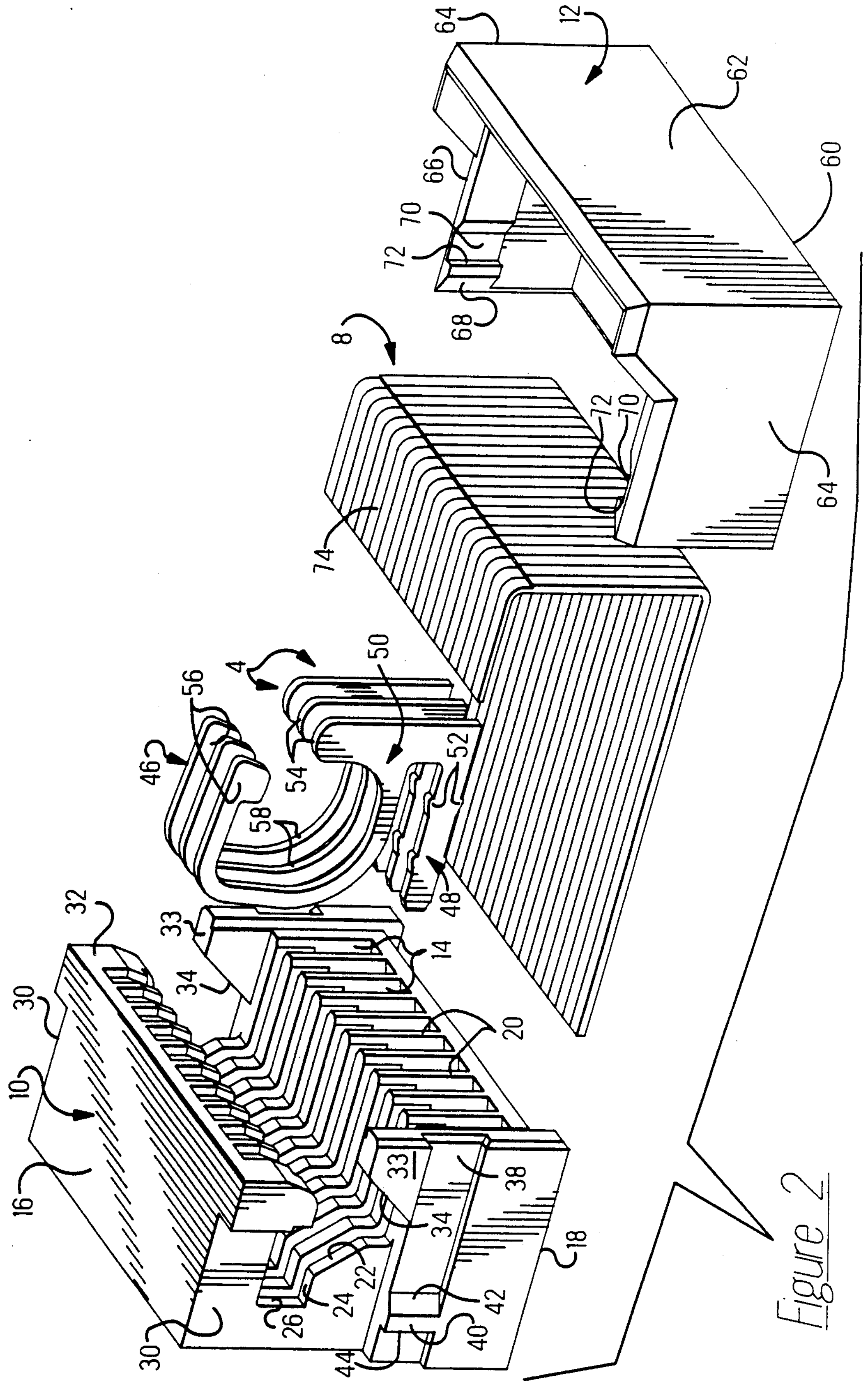
FIG. 2 is an exploded perspective view of the connector shown in FIG. 1, for ease of understanding only three terminals are shown.
Figure 4:
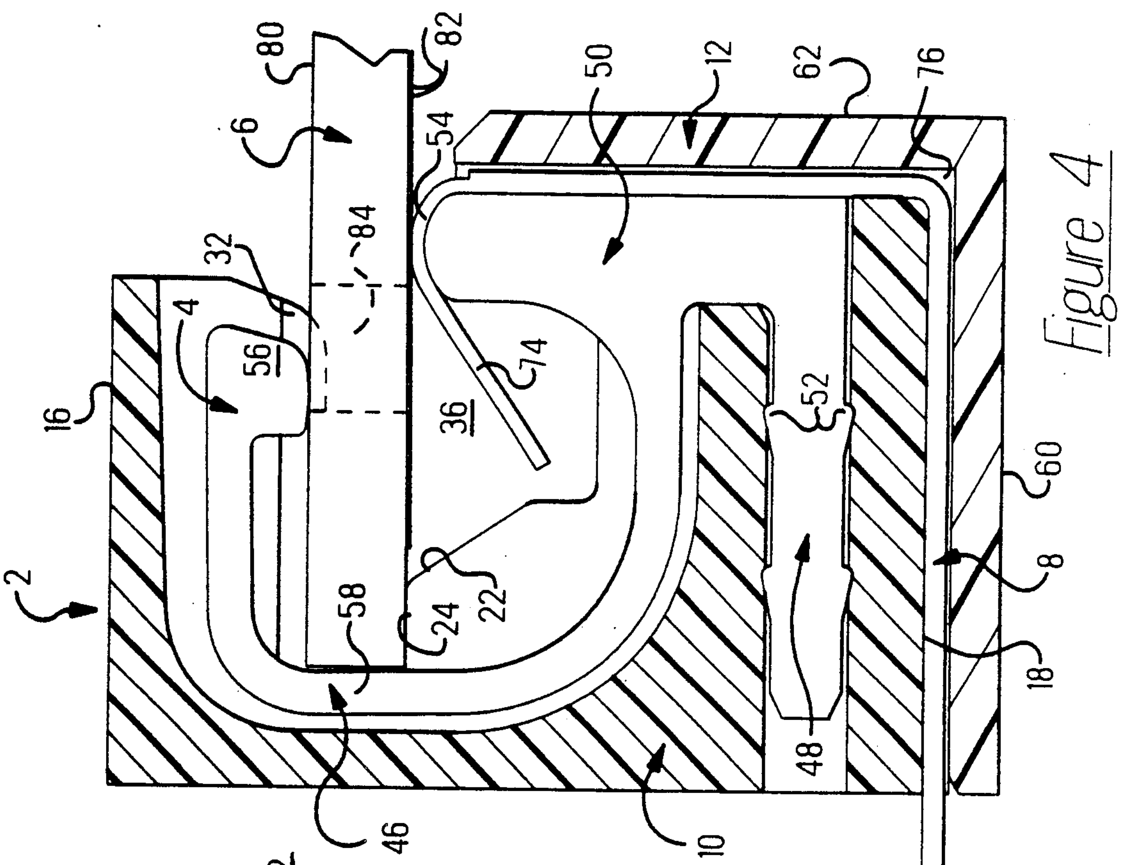
FIG. 4 is a cross-sectional view of the connector with the circuit board in a second or fully inserted position, and the circuit board and cable provided in electrical engagement with each other.

As is best shown in FIGS. 2 and 4, an electrical connector 2 has terminals 4 which are provided to insure that a reliable electrical connection is effected and maintained between a printed circuit board 6 and flexible cable 8. The termination is effective and reliable over time due to the resilient nature of the terminals. Field application of the connector is made easy, as no mounting hardware is required in field applications.

Referring to FIG. 2, electrical connector 2 has a housing 10 and a shroud 12 which cooperates with the housing to maintain the cable in position relative to the connector. Terminal receiving recesses 14 are provided in housing 10. The recesses 14 extend from proximate the upper surface 16 of housing 10 to proximate the lower surface 18. Walls 20 are positioned between recesses 14 to insure that the proper spacing and separation is provided between the terminals. It is worth noting that the configuration of the walls 20 provides the space required to allow the printed circuit board 6 to be inserted into the housing 10, as will be more fully discussed.

Figure 5:
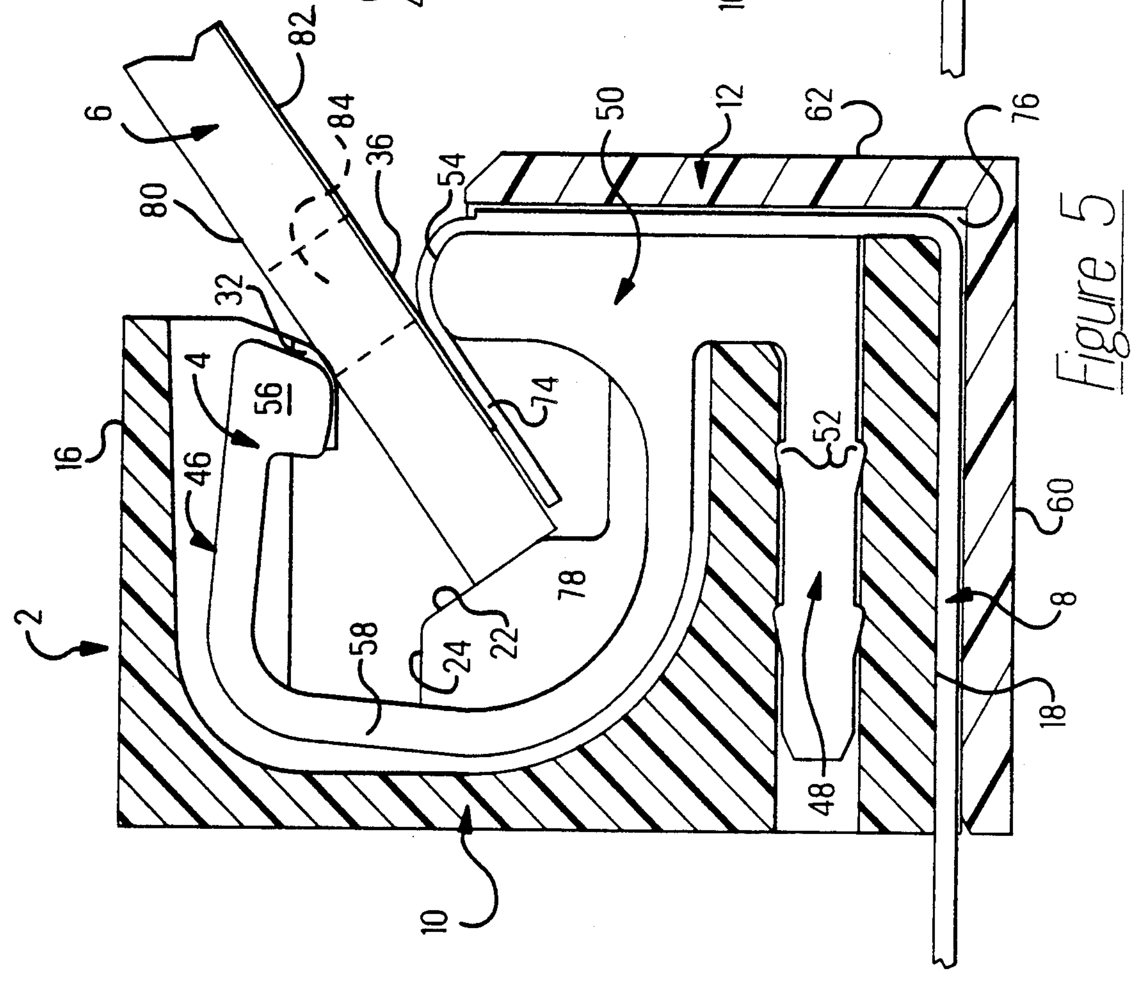
FIG. 5 is a cross-sectional view of the connector, similar to FIG. 4, with the exception that the printed circuit board is in a first or initial position.

As best shown in FIGS. 2, 4 and 5, each wall 20 has a first stop surface 22 provided thereon. In the particular configuration shown, the first stop surface 22 is provided at an angle relative to the upper surface 16 of the housing 10. Extending from an end of the first stop surface 22 is a securing shoulder 24. The securing shoulder 24 is provided in a plane which is essentially parallel to the plane of the upper surface. A second stop surface 26 is provided proximate the securing shoulder 24. The second stop surface 26 extends in a direction which is essentially perpendicular to the direction of the securing shoulder 24.

Provided at either end 30 of housing 10 are locking projections 32. As is best shown in FIGS. 2 and 4, locking projections 32 extend from proximate the upper surface 16 of housing 10, toward the lower surface 18.

It is worth noting, that locking projections 32 provide the means to insure that the upper portions of terminals 4 will not be deformed beyond their elastic limit. This over-stress protection insures that the terminal and the connector will be effective over many cycles, as the terminals will not take a permanent set.

Walls 20 have projections 33 positioned at each end 30 of housing 10 on which surfaces 34 are provided. The surfaces are provided in essentially the same plane as locking projections 32, and extend in a direction which is essentially perpendicular to the first stop surface 22. The surfaces 34 and the locking projections 32 define a channel 36 into which the circuit board 6 will be inserted.

Latch receiving recesses 38 are provided on ends 30 of housing 10. The recesses 38 extend across the ends 30 in a direction which is essentially parallel to the lower surface 18 of housing 10. Latch projections 40 are positioned in recesses 38. The latch projections have lead-in surfaces 42 and shoulders 44. The shoulders extend in a direction which is essentially perpendicular to ends 30.

Terminals 4, as best shown in FIG. 2, 4 and 5, are stamped from sheet metal having the appropriate electrical and resilient characteristics Each terminal 4 has a mating portion 46, a mounting portion 48, and an intermediate portion 50 which extends between the mating portion 46 and the mounting portion 48.

The longitudinal axis of mounting portions 48 extend in a direction which is essentially perpendicular to the axis of the intermediate portions 50. Barbs 52 extend from side edges of the mounting portions. In the particular embodiment shown, four barbs are provided, however the number of barbs can vary according to need. As the terminals 4 are inserted into the terminal receiving recesses 14, the barbs 52 cause the dielectric material of the housing to be displaced, thereby insuring that the mounting portions 48 of the terminals are maintained in the recesses 14.

Mating portions 46 extend from intermediate portions 50 and have a generally C-shaped configuration. Each mating portion 46 has provided at one end thereof an arcuate camming surface 54, and at the opposed end an enlarged member 56 which supplies a force to the printed circuit board 6, when the circuit board is fully inserted into the housing 10 of the connector 2. Connecting camming surfaces 54 to members 56 are resilient sections 58. Resilient sections 58 provide the resilient characteristics required to allow members 56 to move with respect to camming surfaces 54 between a first position, as shown in FIG. 5, and a second position, as shown in FIG. 4.

Figures 9, 10:
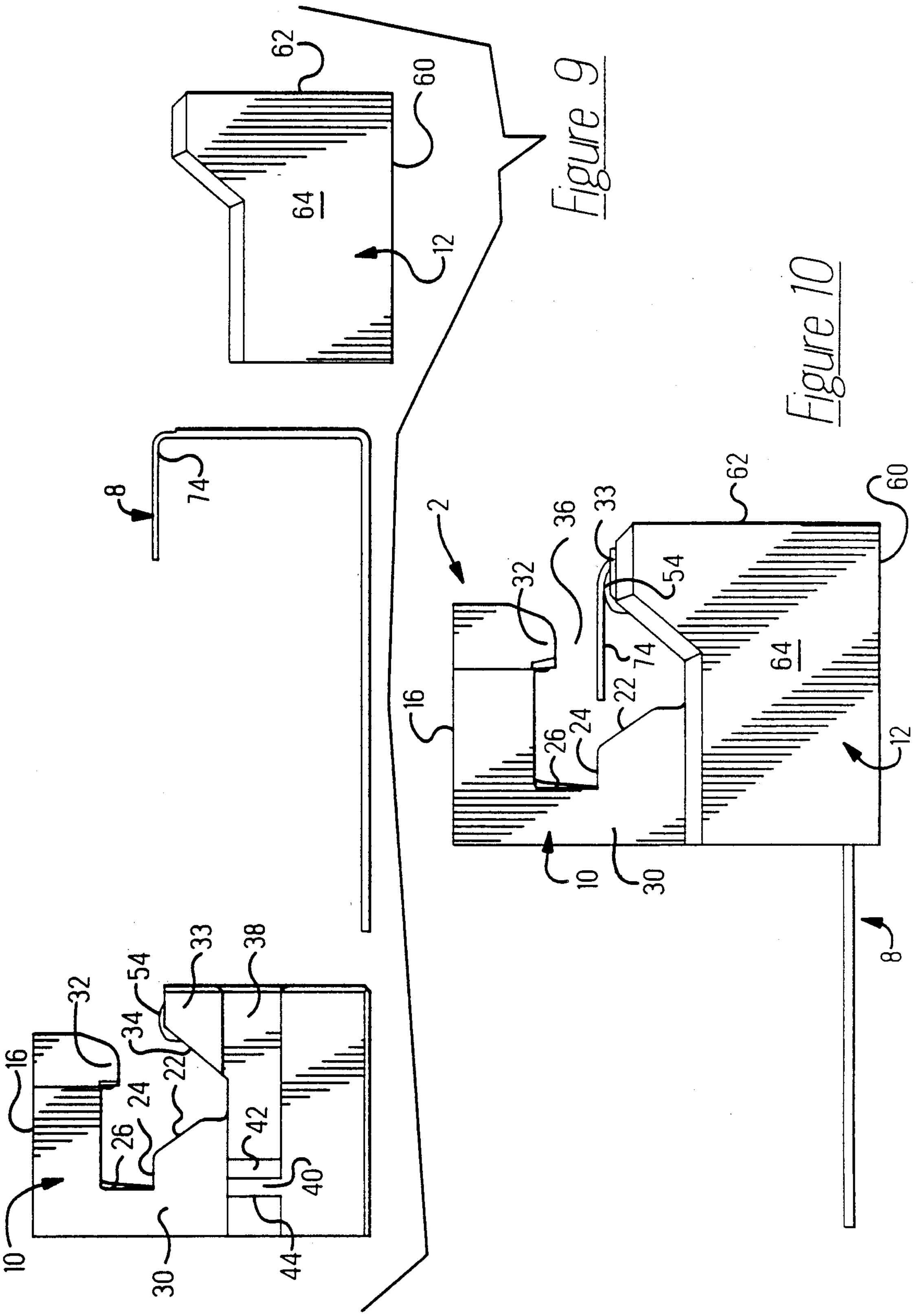
FIG. 9 is an end view of the housing of the connector with the cable and the shroud exploded therefrom.
FIG. 10 is an end view of the connector prior to the insertion of the circuit board.

It is worth noting that when the terminals 4 are properly inserted into the terminal receiving recesses 14, camming surfaces 54 extend beyond projections 33, as best shown in FIGS. 9 and 10. Also, as shown in FIGS. 4 and 5, locking projections 32 extend into the circuit board receiving channel 36 a greater distance than do members 56 of terminals 4.

Referring back to FIG. 2, shroud 12 has a bottom wall 60, a side wall 62, and end walls 64. End walls 64 have latching arms 66 provided thereon. Lead-in surfaces 68 are provided on latching arms, thereby helping to insure that housing 10 will be properly positioned in shroud 12. Latching arms 66 have recesses 70 provided thereon, which are provided proximate the lead-in surfaces 68. The recesses 70 are configured to accept latch projections 40 of housing 10 therein. When projections 40 are positioned in recesses 70, shoulders 72 of latch arms 66 cooperate with shoulders 44 of latch projections 40 to latch shroud 12 to housing 10.

Figure 3:
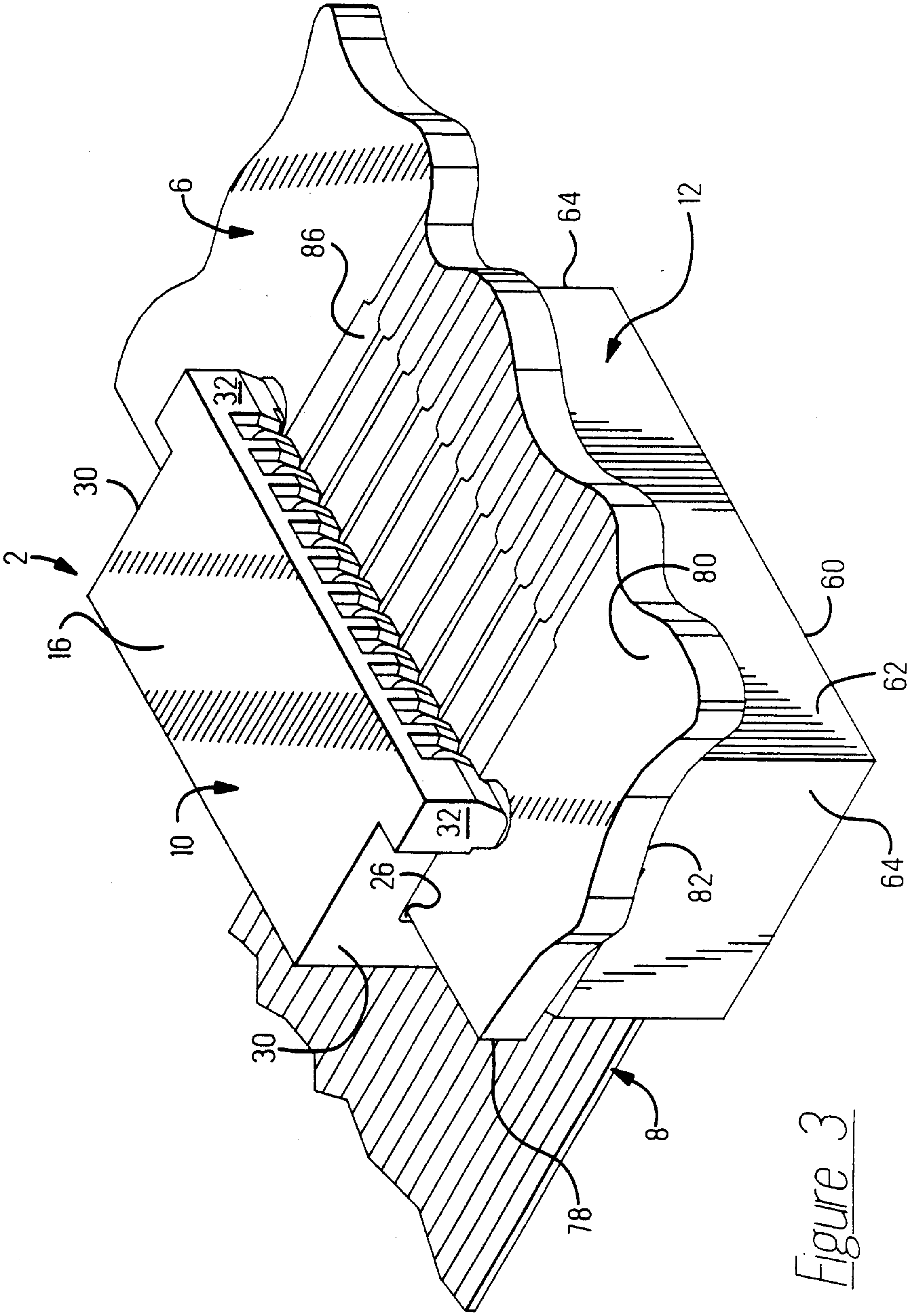
FIG. 3 is a perspective view of the connector shown in FIG. 1 with a printed circuit board positioned and locked to the connector.

It is important to note that in order for shroud 12 to be inserted onto housing 10, the latching arms 66 must be able to be moved away from each other when the latch projections 40 are engaged The latching arms must then return toward their unstressed position when the latch projections 40 are positioned in recesses 70. This resilient nature of latching arms 66 is due to the fact that end walls 64 are not integrally attached to side walls or upper walls on two edges thereof. Consequently, the free edges of the end walls 64 are able to resiliently move between a first position and a second position Connector 2 is assembled by first placing terminals 4 into terminal receiving recesses 14. As was previously discussed, terminals 4 are maintained in the recesses by the cooperation of mounting portions 48 with the walls of the lower portions of recesses 14. Flexible cable 8, with ends 74 thereof stripped of the insulation material to expose the individual conductors, is bent as shown in FIG. 9. The cable is next moved into engagement with hosing 10. It is not required that the cables 8 have all of the insulation removed. In fact, in many instances it is preferred to leave insulation in .place at end 74 in order for the spacing between the conductors to be maintained. However, if the circuit board has conductive areas provided on the bottom surface thereof, the top portion (as shown in FIG. 9) of cables 8 must have the conductors exposed in order to provide the electrical engagement required with the circuit board. The depiction of the conductive areas on the first surface 80 of the circuit board 6 in FIG. 3, is done to better illustrate the configuration of the conductive areas. This figure better corresponds to the embodiment shown in FIG. 11.

Figure 1:
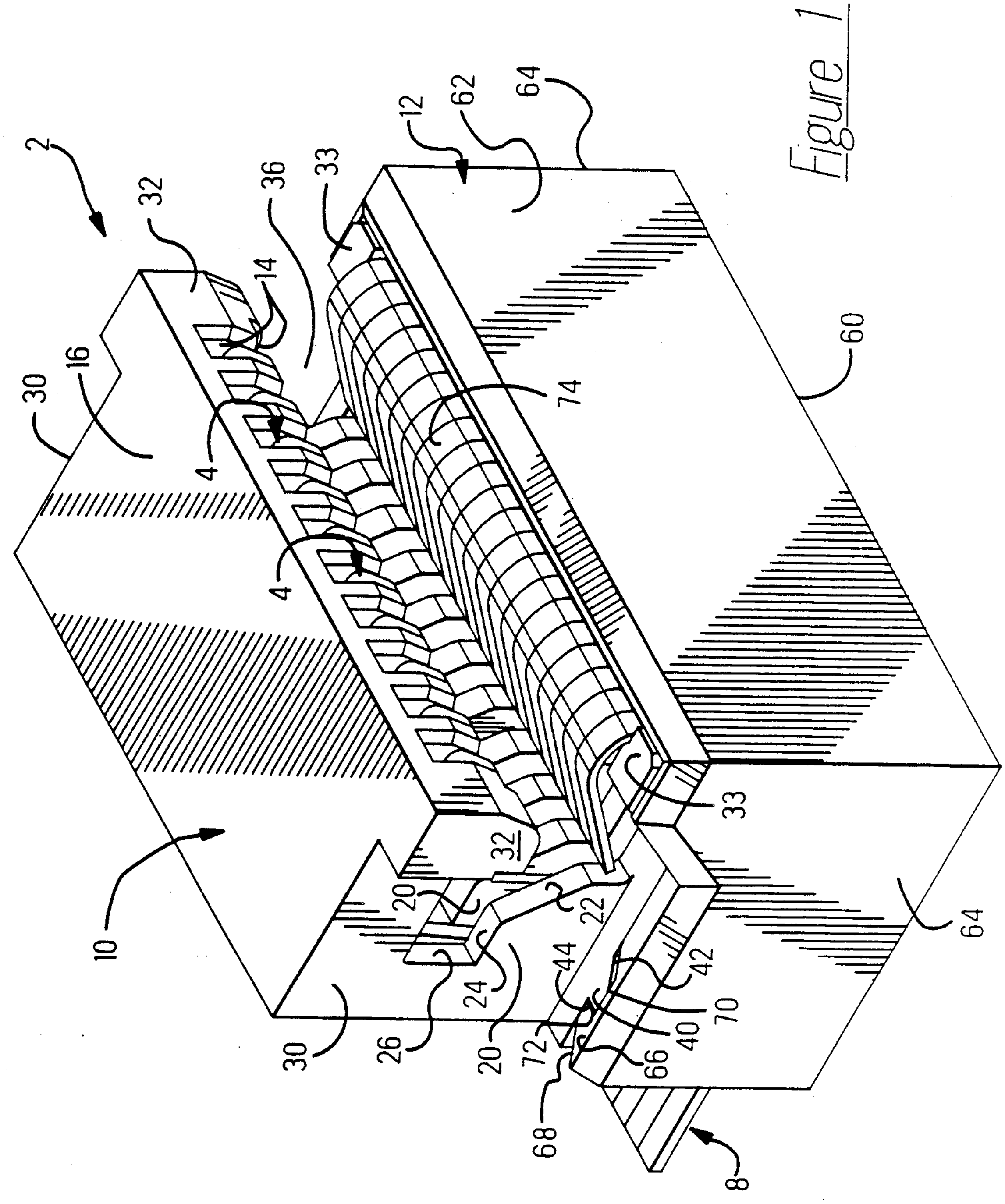
FIG. 1 is a perspective view of an electrical connector of the present invention, the electrical connector has a ribbon cable provided therein.

With cable 8 positioned in place on housing 10, shroud 12 is moved into engagement with the housing. Shroud 12 is fully inserted onto housing 10 when latch projections 40 are positioned in recesses 70 of latching arms 66. This fully inserted position, in which shoulders 44 and 72 cooperate with each other to prevent the removal of the shroud from the housing, is best illustrated in FIG. 1. As is shown in FIGS. 4 and 5, when shroud 12 is properly inserted on housing 10, a ribbon holding channel 76 is provided between the shroud and the housing. This channel is dimensioned to securely maintain the cable 8 in position with respect to the housing 10, however, the spacing of the channel 76 is configured with enough tolerance so as not to damage the cable when the shroud 12 is positioned on the housing 10.

As shown in FIG. 10, when connector 2 is fully assembled, end 74 of cable 8 is bent about arcuate camming surfaces 54 of terminals 4. It is not essential, at this time, that the cable be provided in engagement with surfaces 46, as shown in FIG. 10, but rather the cable must be positioned proximate surfaces 46.

Figure 6:
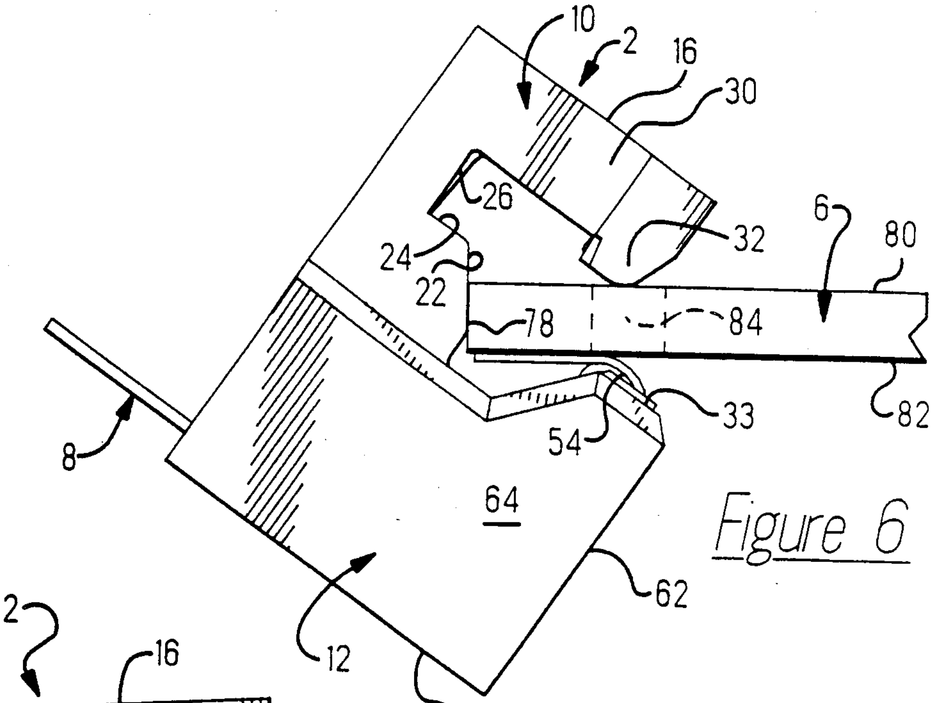
FIG. 6 is an end view of the connector as the connector is initially inserted onto the circuit board.
Figure 7:
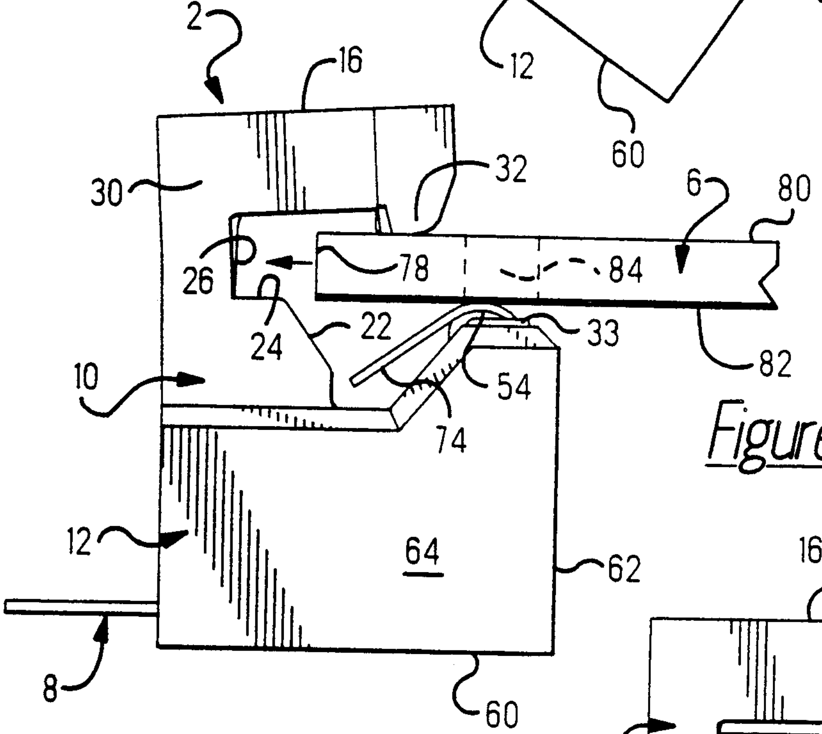
FIG. 7 is an end view, similar to that of FIG. 6, showing the connector partially inserted onto the circuit board.
Figure 8:
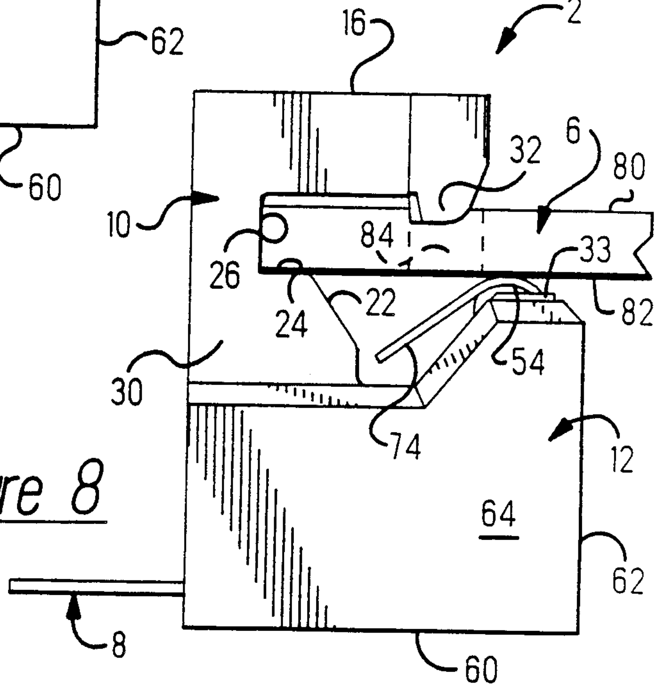
FIG. 8 is an end view, similar to that of FIG. 7, showing the connector fully inserted onto the circuit board.

With connector 2 fully assembled, circuit board 6 is inserted into circuit board receiving channel 36. The insertion process is best illustrated in FIGS. 6 through 8. As is shown in FIG. 6, board 6 is inserted into channel 36 at an angle relative to the surface 16 of housing 10. The insertion of board 6 at an angle allows the board to be positioned in the channel under zero or reduced insertion force conditions. As the board 6 is not biased against any surface during insertion, the insertion of the board can be done easily, with minimal damage to any component. Board 6 is inserted at the angle until a leading surface 78 engages the first stop surface 22 of housing 10.

When leading surfaces 78 of board 6 is provided in engagement with surface 22 of housing 10, board 6 is pivoted about camming surface 54 to the position shown in FIG. 7. In the alternative connector 2 can be pivoted about the board 6, however as the motion is relative, the same results will occur. As the pivoting motion occurs, the first major surface 80 of board 6 engages locking projections 32. This engagement causes locking projections 32 and upper surface 16 of housing 10 to move upward to the position shown in FIG. 7. The pivoting action is completed when surface 80 is positioned in a plane which is essentially parallel to the plane of the lower surface 18 of housing lo. In this position, locking projections 32 and enlarged members 56 are displaced from their initial position, thereby causing projections 32 and members 56 to exert a downward force (as viewed in FIG. 7) on surface 80 of board 6. At the same time, camming surfaces 54 and cable 8 are exerting an upward force on a second major surface 82 of board 6.

With board 6 fully pivoted about camming surface 54, board 6 is moved in the direction indicated by the arrow in FIG. 7. This movement continues until leading surface engages second stop surface 26, as shown in FIG. 8. In this fully inserted position locking projections 32 snap into openings 84 provided in board 6. The cooperation of projections 32 with openings 84 insures that board 6 cannot be accidentally retracted from connector 2. Board 6 is maintained in parallel relationship with lower surface 18 by the camming surfaces 54, the enlarged members 56, and the securing shoulders 24 of walls 20. In this fully inserted position, members 56 remain in a displaced position, which causes members 56 to exert a downward force on board 6. However, as the board is prevented from downward movement by shoulders 24 and camming surfaces 54, the board is secured in the position shown in FIGS. 3 and 8.

Electrical connection is effected between conductive areas 86 of board 6 and the conductors of cable 8, as shown in FIG. 4. Due to the resilient nature of terminals 4, member 56 apply a downward force on board 6, as was previously described. This downward force is of sufficient magnitude to insure that surface 82, upon which conductive areas 86 are provided, is forced into engagement with the conductors of cable 8 Consequently, as the exposed conductors of cable 8 are provided in secure engagement with conductive areas 86, an electrical connection is effected between the cable and the circuit board.

A positive electrical connection is further insured because of the wiping action which occurs between the end 74 of cable 8 and the conductive areas 86 of board 6. When board 6 is moved from the intermediate position shown in FIG. 7 to the fully inserted position shown in FIG. 8, locking projections 32 and members 56 exert a downward force on board 6. Consequently, as board 6 is moved in the direction of the arrow of FIG. 7, the conductive areas 86 are forced to move across the exposed conductors of cable 8. This movement will insure that any oxides, etc. which are present on the conductive areas will be removed, thereby insuring that the conductors and conductive areas will be provided in electrical engagement.

The resiliency of terminals 4 and the configuration of housing 10 insures that a reliable electrical connection will be effected over time. This is true even if the connector is exposed to vibration, etc.

Figure 11:
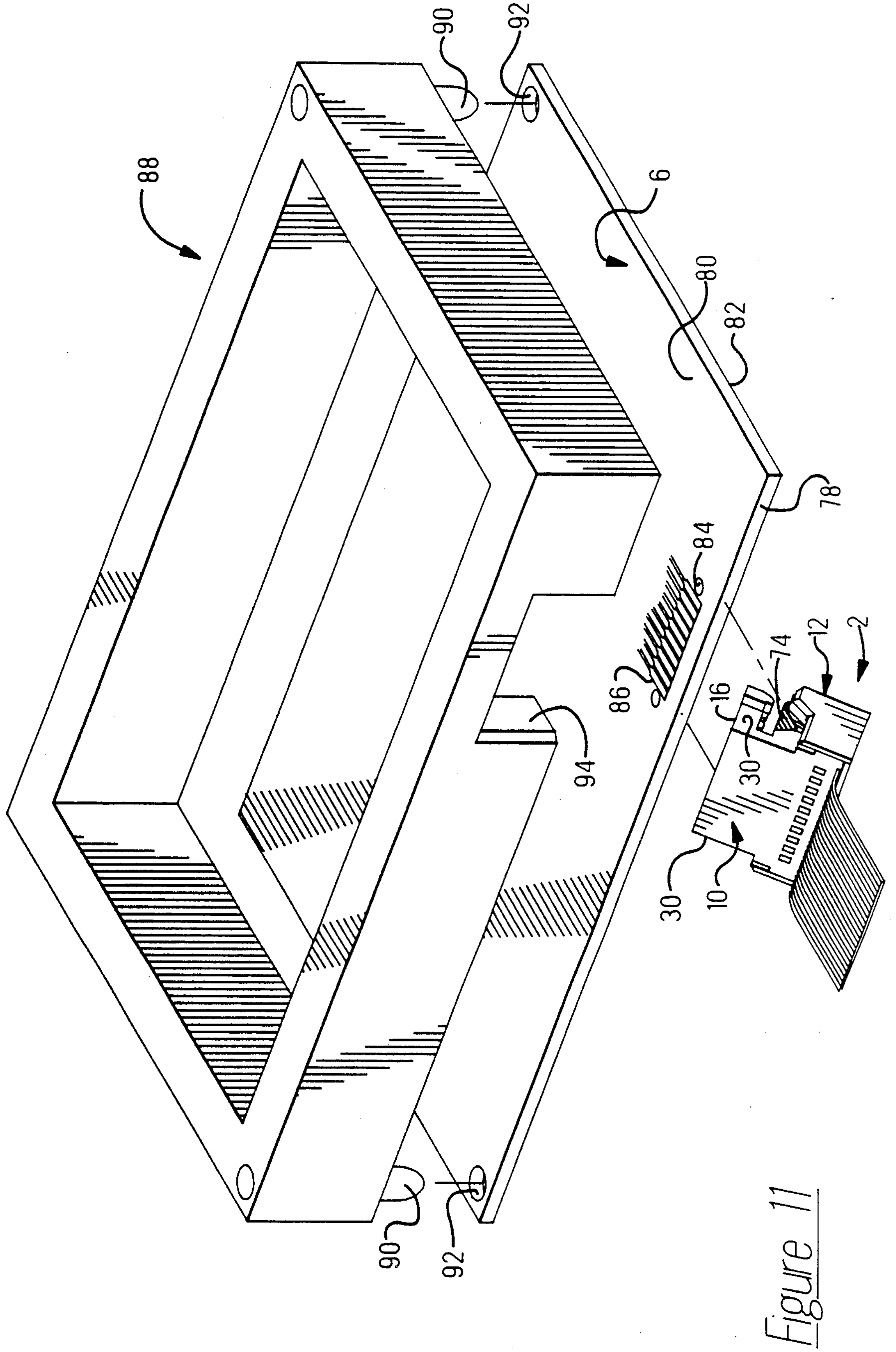
FIG. 11 is a perspective view showing the printed circuit board and a connector to be engaged thereto, the connector is aligned on the circuit board by means of the template shown.

If boards 6 have conductive areas provided on the first surface 80, as is shown in FIG. 11, electrical connection is provided between the conductive areas and the cable 8 by means of the terminals 4. Members 56 of mating portions 46 are provided in electrical engagement with the conductive areas on surface 80 Arcuate camming surfaces 54 of mating portions 46 are provided in electrical engagement with the conductors of cable 8. The electrical signals travel along the resilient sections 46 to provide the electrical connection required between the conductive areas of the board and the conductors of the cable. A wiping action, similar to that previously described, insures that a positive electrical connection is effected In order for this embodiment to perform adequately, end 74 of cable 8 must be stripped on the bottom side of the cable.

With either embodiment described, a frame-like template 88 can be used (FIG. 11). The template is configured so that the sides of the template are no wider than the area covered by the connectors 2 This insures that the valuable board real estate will not be occupied by the template. Each template has two or more guide pins 90 which are aligned with corresponding printed circuit board holes 92, to accurately position and maintain the template on the printed circuit board Slots 94 are milled in the sides of the template and are accurately positioned over each cluster of conductive areas and holes of board 6. Although only one slot is shown in the drawing, the template can have a plurality of slots for receiving a plurality of connectors 2 therein. Each connector is simply aligned between the side walls of the slots and electrically connected to board 6, as was previously described. When utilizing the template there is no need to visually center the connectors over the board, the centering is done by the template This can save considerable time when many connectors are required for each board.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

I claim:

1. An electrical connector for connecting a flexible cable to a circuit board, the circuit board being rotatable between a first position and a second position, the electrical connector comprising:

- a board receiving area being dimensioned to receive he circuit board therein;
- a cable receiving means provided proximate the board receiving area, the cable receiving means cooperate with the cable to retain the cable with respect to the electrical connector;
- support means proximate the board receiving area, the support means provided to cooperate with the circuit board and a respective end of the cable, and being configured to allow the circuit board to be rotated thereabout between the first position and the second position, thereby insuring that the circuit board and cable will be retained in position relative to the electrical connector; and
- resilient means positioned to cooperate with the circuit board when the circuit board is rotated from the first position to the second position, the resilient means applying a force to the circuit board, thereby maintaining the circuit board in cooperation with the support means and insuring that a positive electrical connection is effected between the circuit board and the cable.

2. An electrical connector as recited in claim 1 wherein the electrical connector is placed in a template when the electrical connector is positioned in engagement with the circuit board, the template provides the alignment means required to insure that the circuit board will be provided in electrical engagement with the cable.

3. An electrical connector as recited in claim 1 wherein the circuit board has conductive areas provided on a surface thereof which is proximate a first support means, and the end of the cable has exposed conductors which are provided proximate the first support means, so that as the resilient means applies the force to the circuit board, the conductive areas of the circuit board are forced into engagement with respective exposed conductors at the end of the cable, thereby insuring that a positive electrical connection is effected and maintained between the circuit board and the cable.

4. An electrical connector as recited in claim 1 wherein the electrical connector has a housing which has the board receiving area provided therein, and a shroud which cooperates with the housing to provide the cable receiving means therebetween, the cable receiving means being a cable receiving channel dimensioned to receive the cable therein.

5. An electrical connector as recited in claim 4 wherein the housing of the electrical connector has terminal receiving cavities provided therein, the terminal receiving cavities having terminals which are maintained in the terminal receiving cavities.

6. An electrical connector as recited in claim 5 wherein the support means has first support members and second support members, the first support members are provided on the terminals and are camming surfaces, the second support members are shoulders provided on walls which extend between the terminals.

7. An electrical connector as recited in claim 6 wherein the resilient means has first resilient members and second resilient members, the first resilient members provided on the terminals and the second resilient members provided on the housing.

8. An electrical connector as recited in claim 7 wherein the first resilient members have enlarged portions at the end thereof, the enlarged portions cooperate with the circuit board when the circuit board is inserted into the board receiving area of the connector.

9. An electrical connector as recited in claim 8 wherein the first resilient members have electrical characteristics, the enlarged portions are provided in electrical engagement with conductive areas provided on a surface of the circuit board and the camming surfaces of the terminals are provided in electrical engagement with conductor of the cable, such that the first resilient members provide the means to place the circuit board in electrical engagement with the cable.

10. An electrical connector as recited in claim 9 wherein the second resilient members have locking projections provided thereon, the locking projections cooperate with openings provided on the circuit board when the circuit board in fully inserted into the connector, the locking projections cooperate with the openings to insure that the circuit will not be disengaged from the connector.

11. An electrical connector for electrically connecting a flexible cable to a circuit board, the circuit board being movable between a first position and a second position, the electrical connector comprising:

- a board receiving area being dimensioned to receive the circuit board therein, the circuit board being inserted into the board receiving area in the first position;
- a cable receiving means provided proximate the board receiving area, the cable receiving means cooperate with the cable to retain an end of the cable in the board receiving area;
- first support means adjacent the board receiving area, the first support means provided to cooperate with the circuit board and the end of the cable, and being configured to allow the circuit board to be pivoted thereabout from the first position to an intermediate position, thereby placing the circuit board and the cable in electrical engagement;
- second support means cooperate with the circuit board when the circuit board is moved from the intermediate position to the second position, to maintain the circuit board in the second position; and resilient means positioned to cooperate with the circuit board when the circuit board is moved from the first position to the second position, the resilient means applying a force to the circuit board, thereby maintaining the circuit board in cooperation with the support means and insuring that a positive electrical connection is effected and maintained between the circuit board and the cable.

12. An electrical connector as recited in claim 11 wherein the electrical connector is placed in a template when the electrical connector is positioned in engagement with the circuit board, the template provides the alignment means required to insure that the circuit board will be provided in electrical engagement with the cable.

13. An electrical connector as recited in claim 11 wherein the circuit board has conductive areas provided on a surface thereof which is proximate the first support means and the end of the cable has exposed conductors which are provided proximate the first support means, so that as the resilient means applies the force to the circuit board, the conductive areas of the circuit board are forced into engagement with respective exposed conductors at the end of the cable, thereby insuring that a positive electrical connection is effected and maintained between the circuit board and the cable.

14. An electrical connector as recited in claim 11 wherein the electrical connector has a housing which has the board receiving area provided therein, and a shroud which cooperates with the housing to provide the cable receiving means therebetween, the cable receiving means being a cable receiving channel dimensioned to receive the cable therein.

15. An electrical connector as recited in claim 14 wherein the housing of the electrical connector has terminal receiving cavities provided therein, the terminal receiving cavities having terminals provided therein.

16. An electrical connector as recited in claim 15 wherein the first support members are provided on the terminals and are camming surfaces, the second support members are shoulders provided on walls of the housing which extend between the terminals.

17. An electrical connector as recited in claim 16 wherein the resilient means has first resilient members and second resilient members, the first resilient members provided on the terminals and the second resilient members provided on the housing.

18. An electrical connector as recited in claim 17 wherein the first resilient members have electrical characteristics, ends of the first resilient members are provided in electrical engagement with conductive areas provided on a surface of the circuit board and the camming surfaces of the terminals are provided in electrical engagement with conductor of the cable, such that the first resilient members provide the means to place the circuit board in electrical engagement with the cable.

19. An electrical connector for connecting one or more flexible cables to a circuit board, the electrical connector comprising:

housing means which are movable between a first position and a second position;

board receiving areas provided in the housing means, the board receiving areas being dimensioned to receive the circuit board therein;

cable receiving means provided proximate the board receiving areas, the cable receiving means cooperate with respective cables to retain the cables in position with respect to the respective housing means;

support means proximate the board receiving area, the support means provided to cooperate with the circuit board and respective ends of the cables, thereby insuring that the circuit boards and cables will be retained in position relative to the housing means;

resilient means positioned to cooperate with the circuit board when the housing means are moved from the first position to the second position, the resilient means applying a force to the circuit board, thereby maintaining the circuit board in cooperation with the support means and insuring that a positive electrical connection is effected between the circuit board and the respective cable; and alignment means for insuring that the housing means are properly positioned on the circuit board the alignment means is a template in which the housing means are positioned, the template provides the alignment required to insure that the circuit board will be provided in electrical engagement with the cables.

20. An electrical connector as recited in claim 19 wherein each housing means has a housing member and a shroud, the housing members having the board receiving areas provided therein, the shrouds cooperate with the housing members to provide the cable receiving means therebetween, the cable receiving means being cable receiving channels dimensioned to receive the cables therein.

* * * * *